(12) United States Patent
Yang

(10) Patent No.: US 7,577,013 B2
(45) Date of Patent: Aug. 18, 2009

(54) STORAGE UNITS AND REGISTER FILE USING THE SAME

(75) Inventor: Wei-Bin Yang, Taichung County (TW)

(73) Assignee: Industrial Technology Research Institute, Hsinchu (TW)

( * ) Notice: Subject to any disclaimer, the term of this patent is extended or adjusted under 35 U.S.C. 154(b) by 16 days.

(21) Appl. No.: 11/232,890

(22) Filed: Sep. 23, 2005

(65) Prior Publication Data

US 2006/0291320 A1 Dec. 28, 2006

(30) Foreign Application Priority Data

Jun. 27, 2005 (TW) .............................. 94121412 A

(51) Int. Cl.
*G11C 11/00* (2006.01)

(52) U.S. Cl. .................. 365/154; 365/189.05; 365/184; 365/189.19; 365/104

(58) Field of Classification Search .................. 365/154, 365/189.05, 184, 189.19, 194
See application file for complete search history.

(56) References Cited

U.S. PATENT DOCUMENTS

| | | | | |
|---|---|---|---|---|
| 4,660,177 A | * | 4/1987 | O'Connor | 365/156 |
| 5,802,003 A | * | 9/1998 | Iadanza et al. | 365/230.03 |
| 5,828,623 A | * | 10/1998 | Dilbeck | 365/230.05 |
| 6,005,794 A | * | 12/1999 | Sheffield et al. | 365/154 |
| 6,377,098 B1 | * | 4/2002 | Rebeor | 327/210 |
| 6,608,775 B2 | * | 8/2003 | Lu et al. | 365/154 |
| 6,608,780 B2 | * | 8/2003 | Shau | 365/189.14 |
| 2002/0071305 A1 | * | 6/2002 | Lu et al. | 365/154 |
| 2006/0215465 A1 | * | 9/2006 | Bhavnagarwala et al. | 365/189.12 |
| 2006/0245239 A1 | * | 11/2006 | Sumita | 365/154 |

* cited by examiner

*Primary Examiner*—Thong Q Le
(74) *Attorney, Agent, or Firm*—Birch, Stewart, Kolasch & Birch, LLP

(57) ABSTRACT

A storage unit capable of retaining data during sleep mode. The storage unit includes a first latch composed of first and second inverters and a second latch composed of the first inverter and a third inverter, in which the first and second inverters have different threshold voltages. The first inverter comprises an input terminal coupled to a write port and an output coupled to a read port. The second inverter comprises an input terminal coupled to the read port and an output terminal coupled to the write port. The third inverter comprises an input terminal coupled to the write port and an output terminal coupled to the read port.

20 Claims, 7 Drawing Sheets

STORAGE UNITS AND REGISTER FILE USING THE SAME

BACKGROUND OF THE INVENTION

1. Field of the Invention

The invention relates to storage units, and more particularly, to storage units capable of retaining data during sleep mode.

2. Brief Discussion of the Related Art

With advances in semiconductor process technology, system on chip (SOC) technology is widely used. Because most semiconductor circuits using system on ship technology are digital circuits, it is important to develop digital circuits with high performance and lower power consumption. Further, in digital circuits, register file (RF) is the most used circuit block, transferring and storing data at high speeds in addition to microprocessor and arithmetic logic unit (ALU).

FIG. 1A shows a conventional single-end storage unit. As shown, the storage unit 100 is controlled by three read control signals re1-re3 and a write control signal wr. The storage unit 100 can maintain latched data in the sleep mode. The storage unit 100, however, experiences current leakage under nanometer process. FIG. 1B shows another conventional single-end storage unit. As shown, the storage unit 100" reduces current leakage in sleep mode by the transistor MS. Write and read operations of the storage units 100 and 100" are similar to those of static random access memory (SRAM).

However, even in sleep mode, data stored in the storage units still may be lost over time, requiring rewrite of the lost data by the host system or an external storage unit when reverting to operating mode from sleep mode. However, the external storage unit not only increases chip area and cost but also dynamic power consumption during rewriting in addition to that caused by current leakage.

SUMMARY OF THE INVENTION

Embodiments of a storage unit are disclosed. The storage unit comprises a first latch composed of first and second inverters and a second latch composed of the first inverter and a third inverter, in which the first and second inverters have different threshold voltages. The first inverter comprises an input terminal coupled to a read port and an output coupled to a write port. The second inverter comprises an input terminal coupled to the write port and an output terminal coupled to the read port. The third inverter comprises an input terminal coupled to the read port and an output terminal coupled to the read port.

The invention also discloses embodiments of a register file, in which a storage unit array comprises a plurality of the disclosed storage units and a decoding unit driving the storage unit array to write or read data.

The invention also discloses embodiments of a processing unit comprising a register file as disclosed and a control unit instructing the register file to store and/or transfer data.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention can become more fully understood by the subsequent detailed description and the accompanying drawings, which are given by way of illustration only and thus are not limitative of the present invention, and wherein.

DETAILED DESCRIPTION

Figure 2:
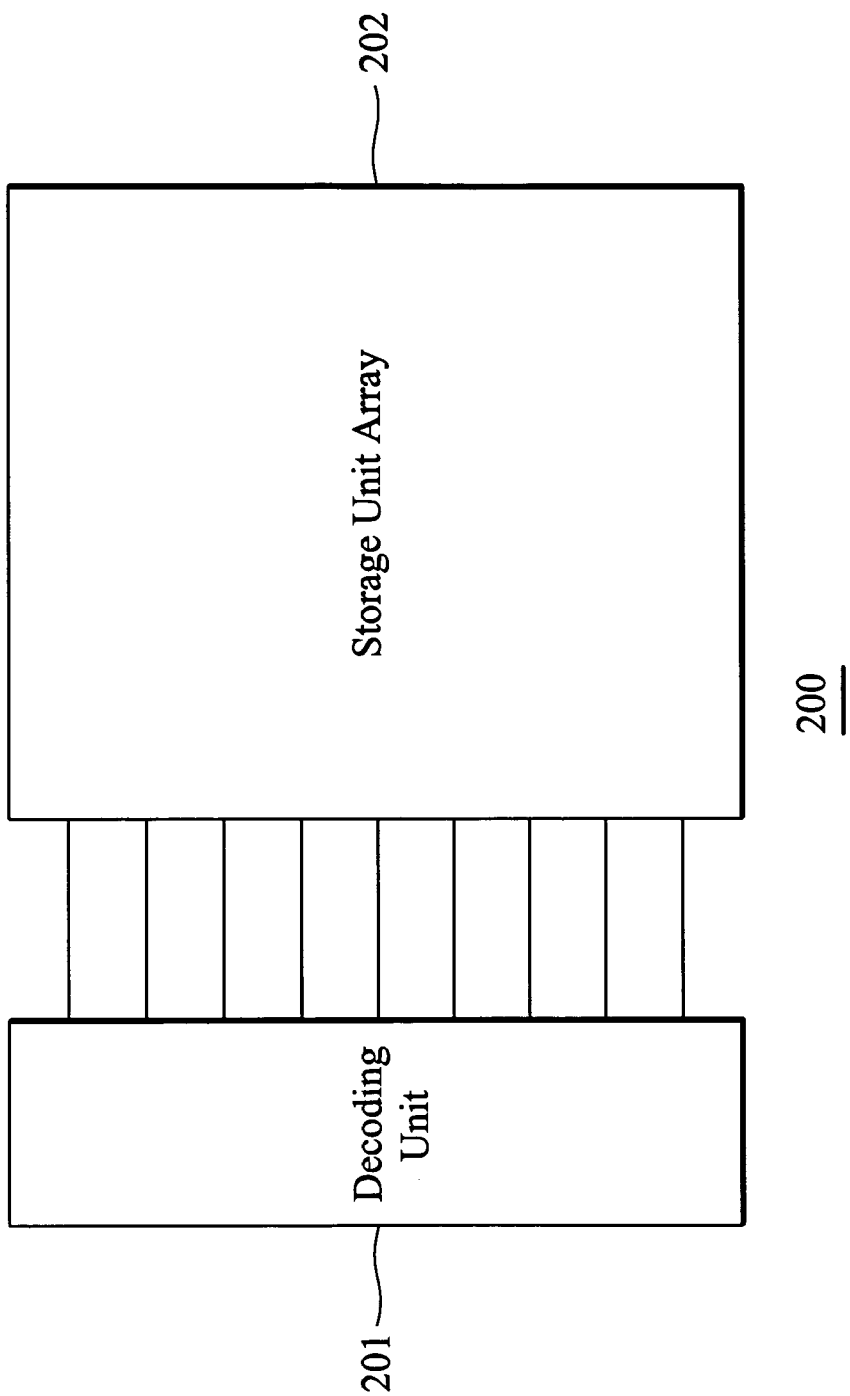
FIG. 2 shows an embodiment of a register file

FIG. 2 shows an embodiment of a register file. As shown, the register file 200 comprises a decoding unit 201 and a storage unit array 202. The decoding unit 201 comprises two sets of address decoders, one is a read decoder and the other is a write decoder. The decoding unit 201 drives the storage unit array 202 to store or read data according to a control signal from a control unit (not shown). The storage unit array 202 can comprise a plurality of storage units arranged in matrix (not shown in FIG. 2) to store data.

Figure 3A:
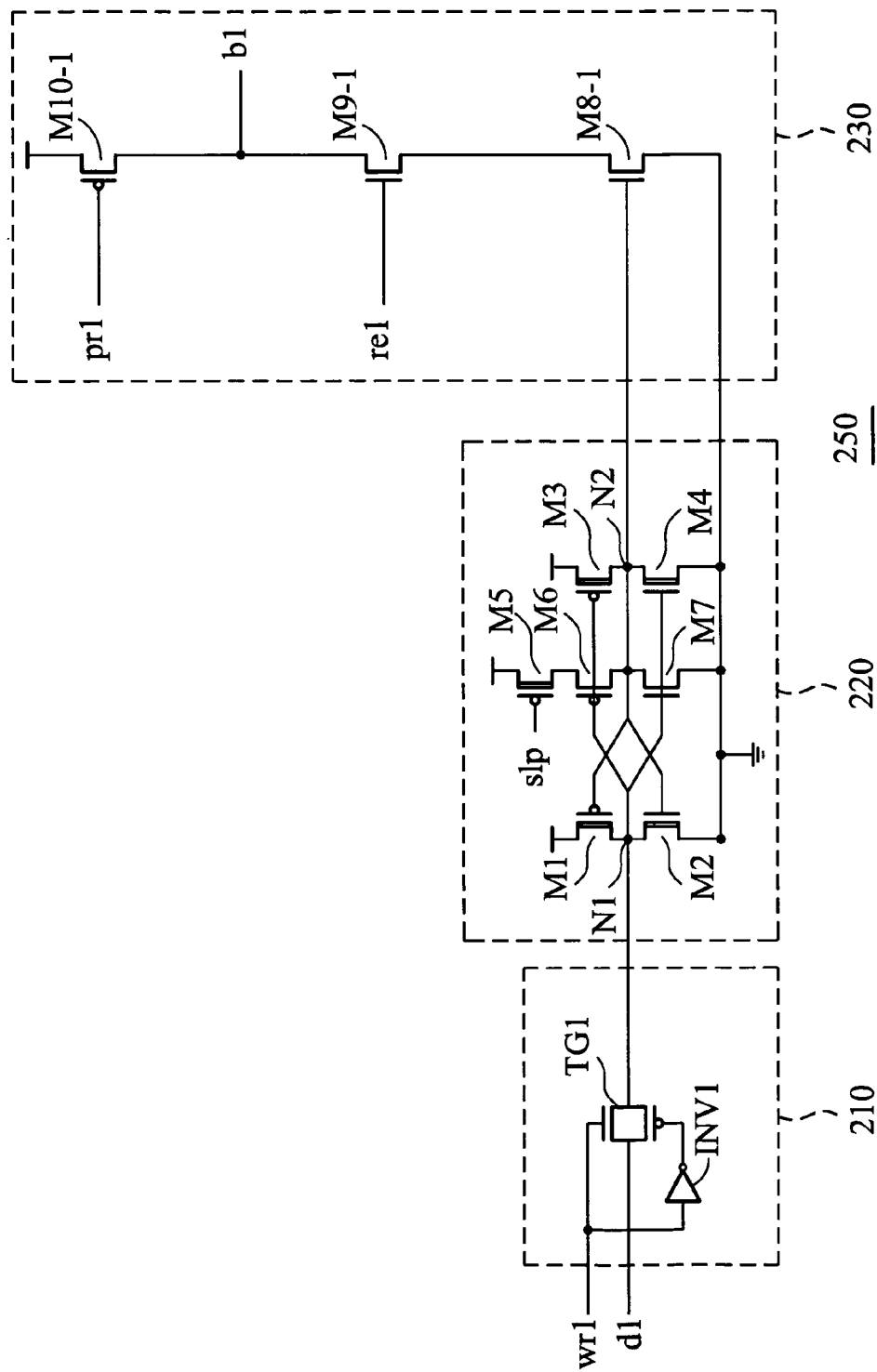
FIG. 3A shows an embodiment of storage units.

FIG. 3A shows an embodiment of storage units. As shown, the storage unit 250 can be a 1w/1r single-end storage unit, comprising a write port 210, a storage cell 220 and a read port 230. The write port comprises a transmission gate TG1 and an inverter INV1, in which the transmission gate TG1 comprises an input terminal coupled to a write data d1, two control terminals coupled to a write control signal wr1 and an output terminal of the inverter INV1 respectively, and an output terminal. The write port 210 inputs the write data to the storage cell 220 according to the write control signal wr1.

The storage cell 220 comprises transistors M1-M7. The transistor M1 comprises a source terminal coupled to a power voltage Vdd, a drain terminal coupled to a node N1 and a gate terminal coupled to a node N2. The transistor M2 comprises a source terminal coupled to a ground voltage GND, a drain terminal coupled to the node N1 and a gate terminal coupled to the node N2. The transistors M1 and M2 construct a first inverter, in which the transistor M1 can be a PMOS transistor wit a high threshold voltage, such as 0.5V~0.6V, and the transistor M2 can be a NMOS transistor with a high threshold voltage, such as 0.4V~0.5V. Alternately, the transistors M1 and M2 can act as high threshold voltage CMOS transistors.

The transistor M3 comprises a source terminal coupled to the power voltage Vdd, a drain terminal coupled to the node N2, and a gate terminal coupled to the node N1. The transistor M4 comprises a source terminal coupled to the ground voltage GND, a drain terminal coupled to the node N2 and a gate terminal coupled to the node N1. The transistors M3 and M4 construct a second inverter, in which the transistor M3 can be a PMOS transistor with a high threshold voltage, such as 0.5V~0.6V, and the transistor M4 can be a NMOS transistor with a high threshold voltage, such as 0.4V~0.5V. Alternately, the transistors M3 and M4 can act as a high threshold voltage CMOS transistors.

The transistor M5 comprises a source terminal coupled to the power voltage Vdd, a drain terminal coupled to the transistor M6, and a gate terminal coupled to a sleep control signal slp. The transistor 146 comprises a source terminal coupled to the drain terminal of the transistor M5, a drain terminal coupled to the node N2, and a gate terminal coupled to the node N1. The transistor M7 comprises a source terminal coupled to the ground voltage GND, a drain terminal coupled to the node N2 and a gate terminal coupled the node N1. The transistors M6 and M7 construct a third inverter, in which the transistor M6 can be a PMOS transistor with a low threshold voltage, such as 0.4V~0.5V, and the transistor M7 can be a NMOS transistor with a low threshold voltage, such as 0.3V~0.4V. Alternately, the transistors M6 and M7 can be regards as low threshold voltage CMOS transistors.

Moreover, transistors M1-M4 construct a first latch and the transistors M1-M2 and M6-M7 construct a second latch. Because transistors M1-M4 are high threshold voltage transistors and transistors M6-M7 are low threshold voltage transistors, the second latch has a threshold voltage lower than that of the first latch. Thus, the second latch can latch write data before the first latch comprising transistors M1-M4 during a write mode.

The read port 230 comprises transistors M8_1, M9_1 and M10_1. Transistor M8_1 comprises a source terminal coupled to the ground voltage GND, a gate terminal coupled to the node N2 and a drain terminal coupled to the transistor M9_1. The transistor M9_1 comprises a source terminal coupled to the drain terminal of the transistor M8_1, a gate coupled to a read control signal re1 and a drain terminal coupled to a bit line b1. The transistor M10_1 comprises a source coupled to the power voltage Vdd, a gate terminal coupled to a precharge control signal pr1, and a drain terminal coupled to the bit line b1. The read port 230 transfers the write data stored in the storage cell 220 to the bit line b1 according to the read control signal re1 and charges the bit line b1 to the power voltage Vdd according to the precharge control signal pr1. For example, the write control signal wr1, the read control signal re1 and the precharge control signal pr1 can be generated by the decoding unit 201.

Storage cell 220 in the invention comprises two latches with different threshold voltages, one maintaining operation speed and the other maintaining data during sleep mode.

During a write mode, transfer gate TG1 transfers the write data to the storage cell 220 according to the write control signal wr1. For example, the write data can be data of 1 bit, such as logic 1 or logic 0. The write data is latched by the storage cell 220. If the write data is logic 1, the transistors M4 and M7 are turned on to pull the voltage at the node N2 low to the ground voltage GND, in which the transistor M7 is turned on before the transistor M4 due to different threshold voltages. Further, the transistor M1 is turned on to pull the voltage at the node N1 high according to the ground voltage GND at the node N2. Because the voltage at the node N1 is pulled high and the voltage at the node N1 is pulled low, the write data d1 is latched in the storage cell 220.

The transistor M10_1 is turned on to pull the bit line b1 high to the power voltage Vdd before a read mode, according to the precharge control signal pr1. During the read mode, the transistor M9_1 is turned on according to a read control signal signal re1, the voltage level at the bit line is maintained at the power voltage Vdd or pulled to the ground voltage according to whether the transistor M8_1 is turned on. For example, if the write data is logic 1, the voltage at the node N2 is pulled to the ground voltage GND at the write mode. Thus, the transistor M8_1 is not turned on, the voltage on the bit line b1 is maintained at power voltage Vdd, such that logic 1 can be read out. On the contrary, if the write data is logic 0, the voltage at the node N2 is pulled to the power voltage Vdd at the write mode. Thus, the transistor M8_1 is turned on, the voltage on the bit line b1 is pulled to the ground voltage GND, such that logic 0 can be read out.

Low threshold voltage of the transistors M6 and M7 reduce current leakage. During a sleep mode, the transistor M5 is turned off according to a sleep mode control signal slp, such that the inverter composed of the transistor M6 and M7 is electrically separated from the power voltage Vdd, thereby reducing power consumption by current leakage. Further, because the transistors M1-M4 are high threshold voltage MOS transistors, the write data latched before the sleep mode can also be latched in the latch composed of the transistors M1-M4.

Figure 1A:
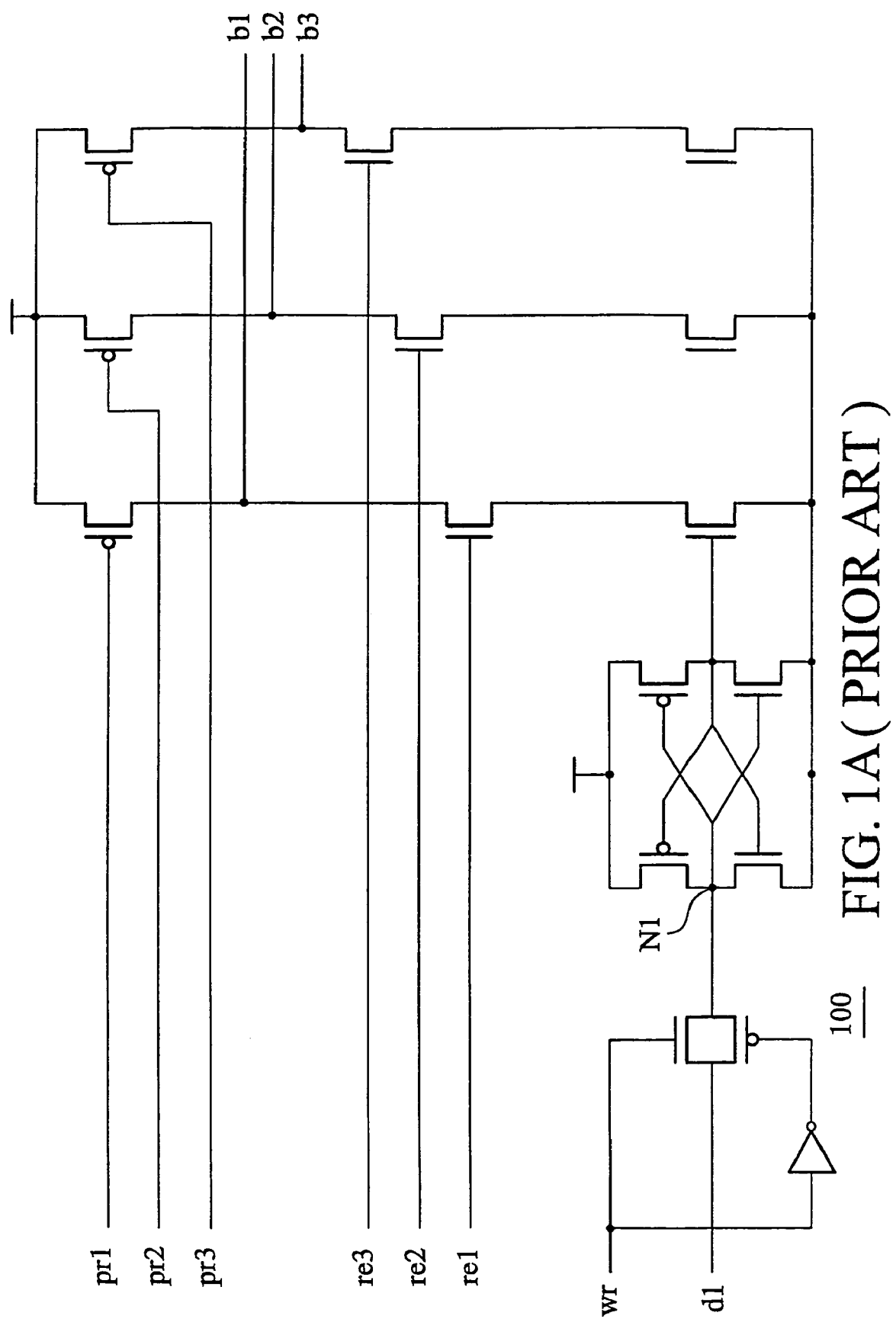
FIG. 1A shows a conventional radio frequency front-end circuit.
Figure 1B:
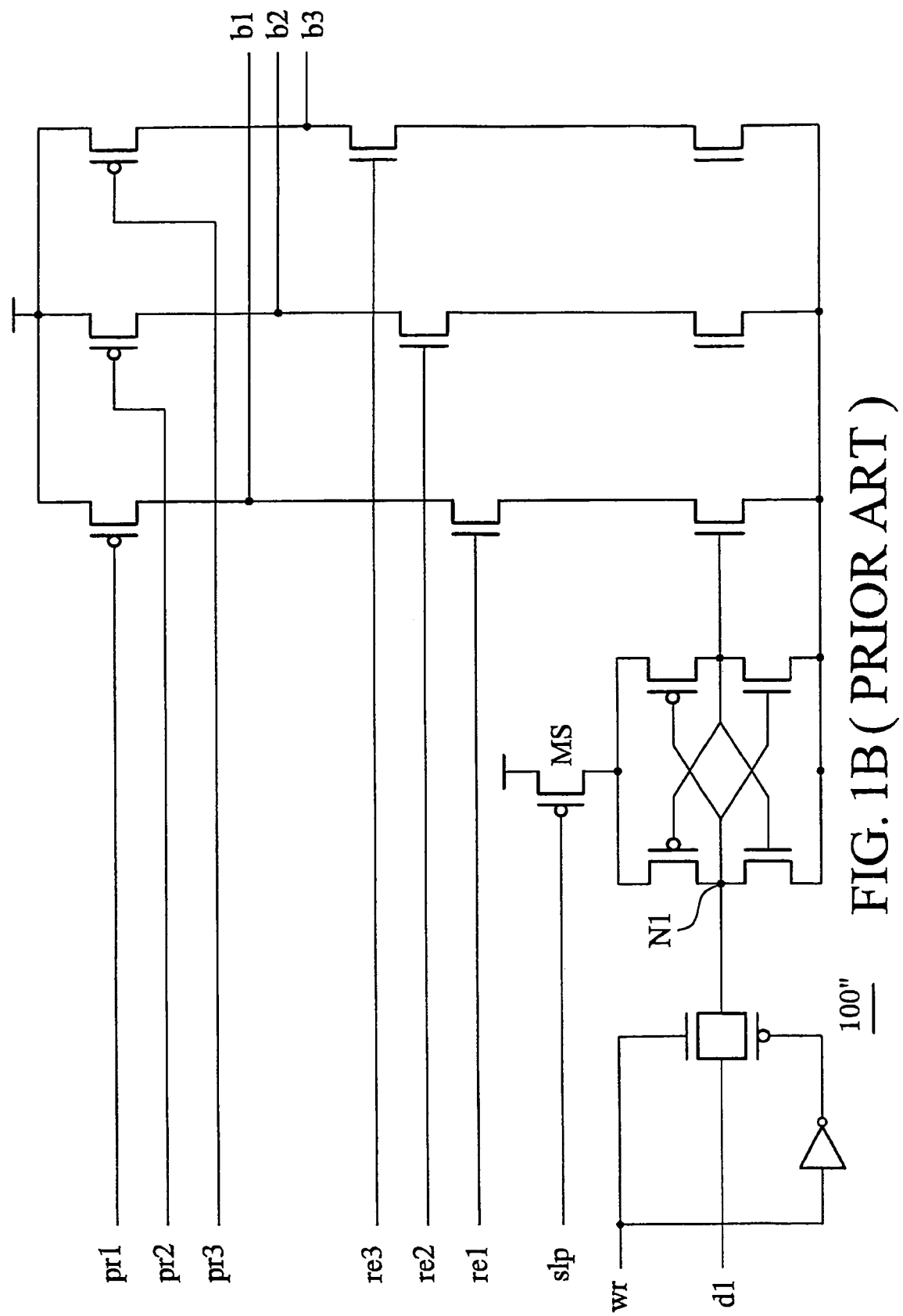
FIG. 1B shows another conventional radio frequency front-end circuit.
Figure 4:
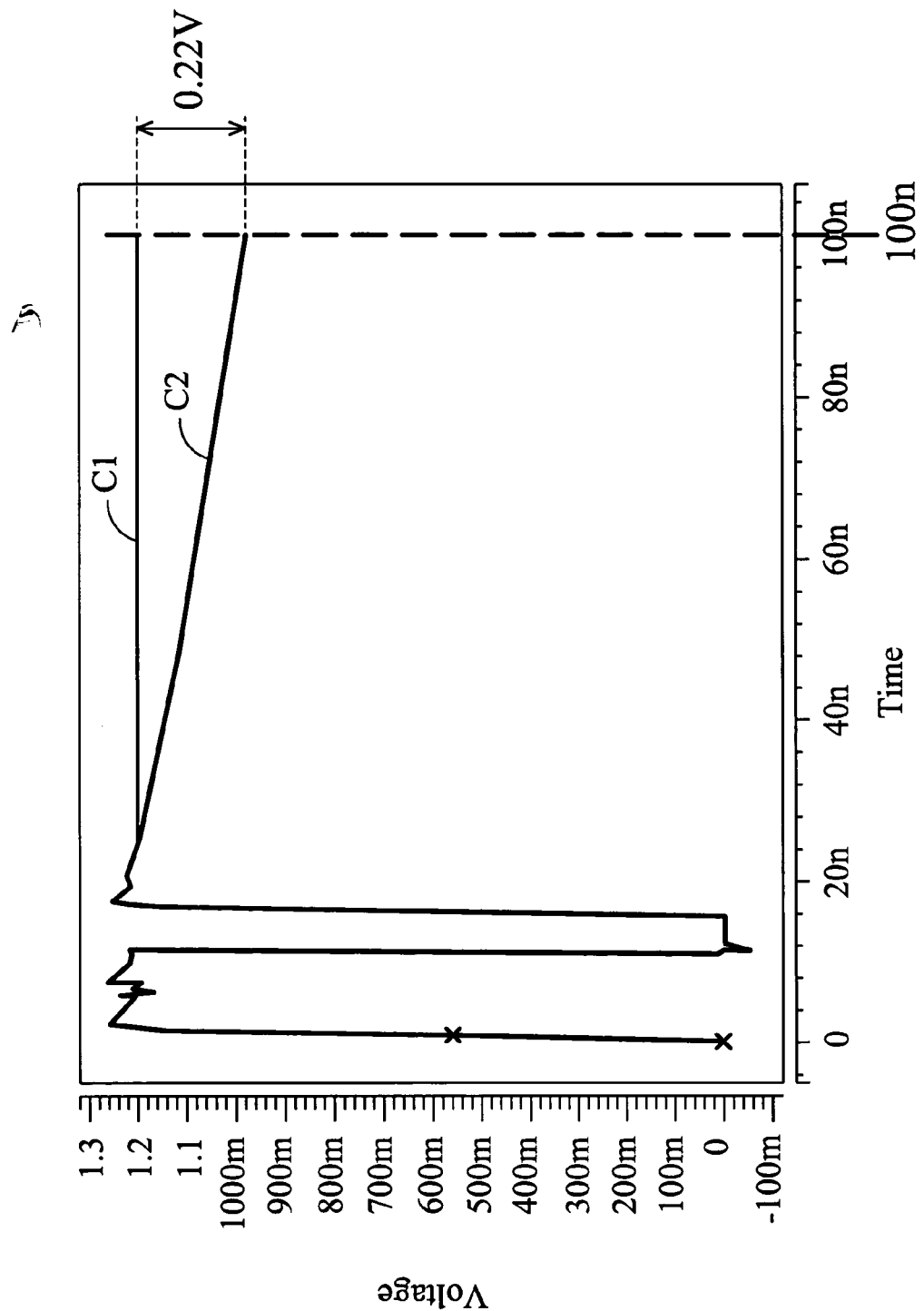
FIG. 4 is a voltage wave diagram of the storage unit.

FIG. 4 is a voltage wave diagram of the storage unit. Curve C1 shows the voltage at the node N1 in the storage unit 250, and curve C2 shows the voltage at the node N1 in the storage 100 shown in FIG. 1. As shown, the voltage at the node N1 in the storage unit 100 is lowed to 1.0V after the sleep mode, such as at 20 ns. Namely, the voltage at the node N1 in the storage unit 100 is lowered to 0V when the sleep time exceeds 600 ns. The voltage at the node N1 in the storage unit 250 of the invention, however, can be maintained at 1.2V without respect to the sleep time.

Because the storage unit of the invention can maintain the write data without respect to the sleep time, an external storage unit, such as SRAM, for rewriting data is not required. Thus, chip area and cost are reduced, and power consumption cased by leakage current and dynamic power consumption caused by rewriting data is also lowed.

Figure 3B:
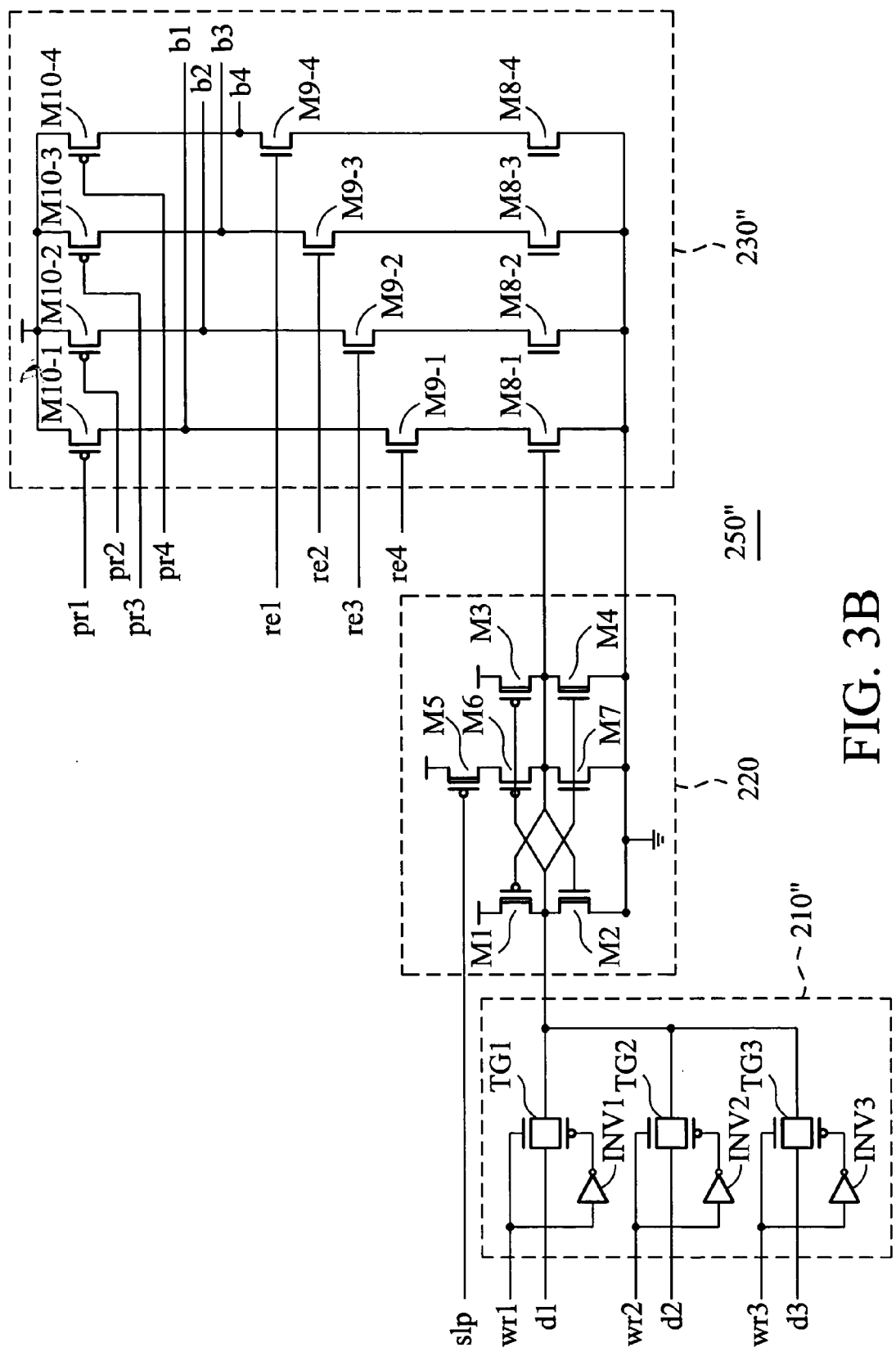
FIG. 3B shows another embodiment of storage units.

FIG. 3B shows another embodiment of a storage unit. As shown, the storage unit 250" is a 3w/4r single-end storage unit and comprises a write port 210", a storage cell 220 and a read port 230". In this embodiment, the write port 210" comprises transmission gates TG1-TG3, and inverters INV1-INV3. The write port 210" inputs the write data d1, d2 and d3 to the storage cell 220 according to write control signals wr1, wr2 and wr3. The storage cell 220 is similar to that shown in FIG. 3A, and is thus omitted for simplification. The read port 230" comprises transistors M8_1-M8_4, M9_1-M9_4 and M10_1-M10_4, transfers the write data stored in the storage unit 220 to the bit lines b1-b4 according to read control signals re1-re4 and pulls the voltages at the bit lines b1-b4 to the power voltage Vdd according to precharge control signals pr1-pr4.

For example, the read control signals re1-re4, the precharge control signals pr1-pr4 and the write control signals wr1-wr3 can be generated by the decoding unit 201 shown in FIG. 2. Operations of the storage units 250" are similar to those of the storage unit 250, and are thus omitted for simplification. The storage unit of the invention is not limited to 1w/1r single-end storage unit or 3w/4r single-end storage unit, be can also be Mw/Nr single-end storage unit, in which N and M are positive integers.

Figure 5:
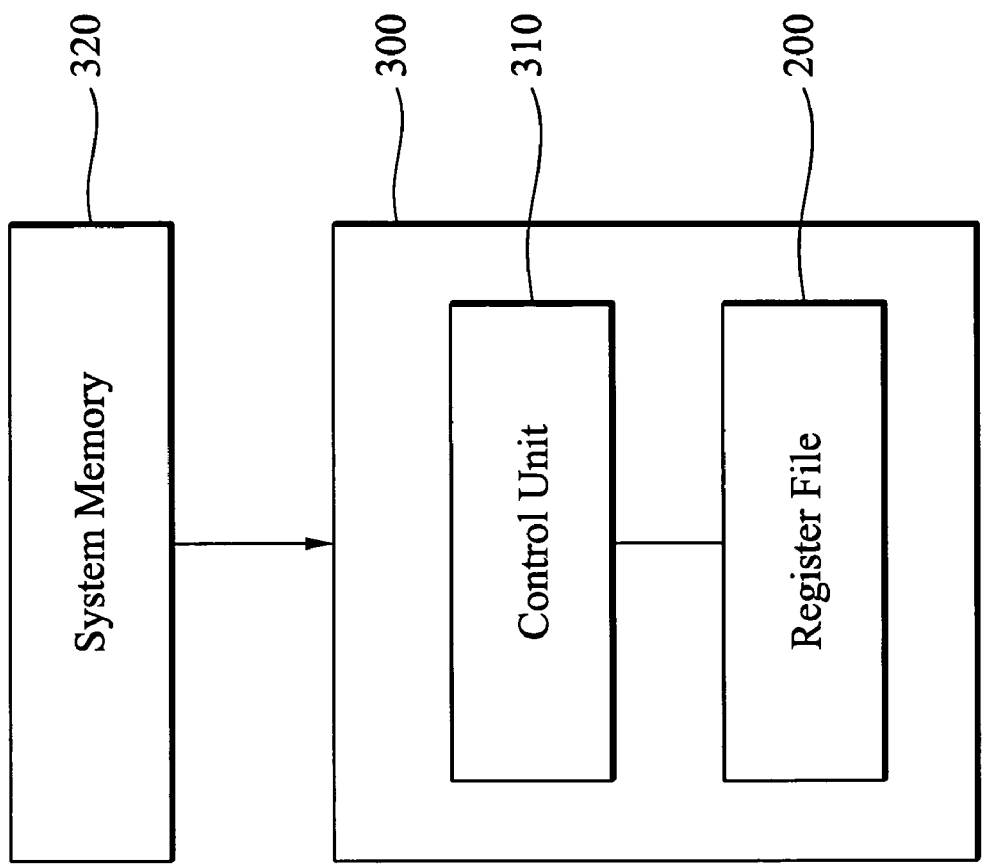
FIG. 5 is a diagram of a processing unit using the register file described.

FIG. 5 is a diagram of a processing unit using the register file described. As shown, the processing unit 300 comprises a control unit 310 and the disclosed register file 200 shown in FIG. 2. For example, the control unit 310 can comprise a fetch unit to retrieve instructions from the system memory 320 and provide corresponding control signals to the register file 200 to write or read data accordingly. The processing unit 300 can, for example, be a central processing unit (CPU), a digital signal processor (DSP) or an arithmetic logic unit (ALU).

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A storage unit, comprising:
 a first inverter having an input terminal coupled to a read port and an output coupled to a write port;
 a second inverter having an input terminal coupled to the write port and an output terminal coupled to the read port, and forming a first latch with the first inverter; and
 a third inverter having an input terminal coupled to the write port and an output terminal coupled to the read port, and forming a second latch with the first inverter, wherein the first latch and the second latch have different threshold voltages.

2. The storage unit as claimed in claim 1, wherein the threshold voltage of the first latch exceeds that of the second latch.

3. The storage unit as claimed in claim 2, wherein the first inverter and the second inverter have high threshold voltage transistors, and the third inverter has low threshold voltage transistors.

4. The storage unit as claimed in claim 3, wherein the first inverter and the second inverter have high threshold voltage CMOS transistors, and the third inverter comprises low threshold voltage CMOS transistors.

5. The storage unit as claimed in claim 3, wherein, during a normal mode, a write data from the write port is updated to the first latch and the second latch though the third inverter, and the write data is maintained by the first latch during sleep mode.

6. The storage unit as claimed in claim 5, further comprising a switching element coupled between a first power voltage and a power terminal of the third inverter, electrically separating the first power voltage from the third inverter during sleep mode.

7. The storage unit as claimed in claim 1, wherein the first inverter comprises:
 a first transistor with a first conductive type having a first terminal coupled to the first power voltage, a control terminal coupled to the read port and a second terminal coupled to the write port; and
 a second transistor with a second conductive type having a first terminal coupled to the write port, a control terminal coupled to the read port and a second terminal coupled to a second power voltage,
 wherein the second inverter comprises:
 a third transistor with the first conductive type having a first terminal coupled to the first power voltage, a control terminal coupled to the write port and a second terminal coupled to the read port; and
 a fourth transistor with the second conductive type having a first terminal coupled to the read port, a control terminal coupled to the write port and a second terminal coupled to the second power terminal, and
 wherein the third inverter comprises:
 a fifth transistor with the first conductive type having a first terminal coupled to the first power voltage, a control terminal coupled to the write port and a second terminal coupled to the read port; and
 a sixth transistor with the second conductive type having a first terminal coupled to the read port, a control terminal coupled to the write port and a second terminal coupled to the second power voltage.

8. The storage unit as claimed in claim 7, wherein the switch element has a seventh transistor with the first conductive type, coupled between the first power voltage and the second terminal of the fifth transistor.

9. The storage unit as claimed in claim 8, wherein the first, third and seventh transistors have high threshold voltage PMOS transistors, the second and fourth transistors have high threshold voltage NMOS transistors, the fifth transistor has a low threshold voltage PMOS transistor and the sixth transistor has a low threshold voltage NMOS transistor.

10. The storage unit as claimed in claim 1, wherein the write port inputs write data to the first and second latches according to a write control signal, and the read port transfers the write data stored in the first and second latches to a bit line according to a read control signal.

11. A register file, comprising:
 a storage unit array having a plurality of storage units; and
 a decoding unit, driving the storage unit array to write or read data,
 wherein each storage unit has:
 a first inverter having an input terminal coupled to a read port and an output coupled to a write port;
 a second inverter having an input terminal coupled to the write port and an output terminal coupled to the read port, and forming a first latch with the first inverter; and
 a third inverter having an input terminal coupled to the write port and an output terminal coupled to the read port, and forming a second latch with the first inverter, wherein the first latch and the second latch have different threshold voltages.

12. The register file as claimed in claim 11, wherein the threshold voltage of the first latch exceeds that of the second latch.

13. The register file as claimed in claim 12, wherein the first inverter and the second inverter have high threshold voltage transistors, and the third inverter has low threshold voltage transistors.

14. The register file as claimed in claim 13, wherein the first inverter and the second inverter have high threshold voltage CMOS transistors, and the third inverter has low threshold voltage CMOS transistors.

15. The register file as claimed in claim 14, wherein, during a normal mode, write data from the write port is updated to the first latch and the second latch through the third inverter, and the write data is maintained by the first latch during a sleep mode.

16. The register file as claimed in claim 15, further comprising a switching element coupled between a first power voltage and a power terminal of the third inverter, electrically separating the first power voltage from the third inverter during the sleep mode.

17. A processing unit, comprising:
 a register file as claimed in claim 11; and
 a control unit instructing the register file to store and/or transfer data.

18. The processing unit as claimed in claim 17, wherein the processing unit is a central processing unit (CPU).

19. The processing unit as claimed in claim 17, wherein the processing unit is a digital signal processor (DSP).

20. The processing unit as claimed in claim 17, wherein the processing unit is an arithmetic logic unit (ALU).

* * * * *